United States Patent
Miller et al.

(10) Patent No.: US 8,762,345 B2
(45) Date of Patent: Jun. 24, 2014

(54) SYSTEM AND METHOD FOR ACCELERATING ANCHOR POINT DETECTION

(75) Inventors: Steven C. Miller, Sunnyvale, CA (US); Roger Stager, Sunnyvale, CA (US)

(73) Assignee: NetApp, Inc., Sunnyvale, CA (US)

( * ) Notice: Subject to any disclaimer, the term of this patent is extended or adjusted under 35 U.S.C. 154(b) by 1526 days.

(21) Appl. No.: 11/756,044

(22) Filed: May 31, 2007

(65) Prior Publication Data

US 2008/0301134 A1    Dec. 4, 2008

(51) Int. Cl.
G06F 17/30 (2006.01)

(52) U.S. Cl.
USPC ............... 707/664; 707/662; 707/692

(58) Field of Classification Search
USPC ............... 707/661, 662, 664, 665, 692
See application file for complete search history.

(56) References Cited

U.S. PATENT DOCUMENTS

| | | | |
|---|---|---|---|
| 4,570,217 A | | 2/1986 | Allen et al. |
| 4,691,280 A | * | 9/1987 | Bennett ............... 710/305 |
| 5,124,987 A | | 6/1992 | Milligan et al. |
| 5,163,131 A | | 11/1992 | Row et al. |
| 5,202,979 A | | 4/1993 | Hillis et al. |
| 5,278,979 A | | 1/1994 | Foster et al. |
| 5,403,667 A | | 4/1995 | Simoens |
| 5,581,724 A | | 12/1996 | Belsan et al. |
| 5,732,265 A | | 3/1998 | Dewitt et al. |
| 5,819,292 A | | 10/1998 | Hitz et al. |
| 5,907,672 A | | 5/1999 | Matze et al. |
| 5,990,810 A | * | 11/1999 | Williams ............... 341/51 |
| 6,061,770 A | | 5/2000 | Franklin |
| 6,081,875 A | | 6/2000 | Clifton et al. |

(Continued)

FOREIGN PATENT DOCUMENTS

| | | |
|---|---|---|
| EP | 1349 089 | 1/2003 |
| IN | 938/DEL/2007 | 4/2007 |

(Continued)

OTHER PUBLICATIONS

Muthitacharoen, Athicha, et al., "A Low-bandwidth Network File System," ACM SOSP. Proceedings of the ACM Symposium on Operating Systemprinciples, ACM, US, XP-002405303, Oct. 21, 2002, pp. 174-187.

(Continued)

Primary Examiner — Vincent F Boccio
(74) Attorney, Agent, or Firm — Cesari and McKenna, LLP

(57) ABSTRACT

A sampling based technique for eliminating duplicate data (de-duplication) stored on storage resources, is provided. According to the invention, when a new data set, e.g., a backup data stream, is received by a server, e.g., a storage system or virtual tape library (VTL) system implementing the invention, one or more anchors are identified within the new data set. The anchors are identified using a novel anchor detection circuitry in accordance with an illustrative embodiment of the present invention. Upon receipt of the new data set by, for example, a network adapter of a VTL system, the data set is transferred using direct memory access (DMA) operations to a memory associated with an anchor detection hardware card that is operatively interconnected with the storage system. The anchor detection hardware card may be implemented as, for example, a FPGA is to quickly identify anchors within the data set. As the anchor detection process is performed using a hardware assist, the load on a main processor of the system is reduced, thereby enabling line speed de-duplication.

20 Claims, 4 Drawing Sheets

(56) References Cited

U.S. PATENT DOCUMENTS

| | | | |
|---|---|---|---|
| 6,289,451 | B1 | 9/2001 | Dice |
| 6,341,341 | B1 | 1/2002 | Grummon et al. |
| 6,374,266 | B1 | 4/2002 | Shnelvar et al. |
| 6,892,211 | B2 | 5/2005 | Hitz |
| 6,912,645 | B2 | 6/2005 | Dorward et al. |
| 7,010,553 | B2 | 3/2006 | Chen et al. |
| 7,043,485 | B2 | 5/2006 | Manley et al. |
| 7,072,910 | B2 | 7/2006 | Kahn et al. |
| 7,079,053 | B2 | 7/2006 | Kolavi |
| 7,103,602 | B2 | 9/2006 | Black et al. |
| 7,124,305 | B2 | 10/2006 | Margolus et al. |
| 7,127,577 | B2 | 10/2006 | Koning et al. |
| 7,162,662 | B1 | 1/2007 | Svarcas et al. |
| 7,289,643 | B2 | 10/2007 | Brunk et al. |
| 7,305,557 | B2 | 12/2007 | Albornoz et al. |
| 7,333,993 | B2 | 2/2008 | Fair |
| 7,475,098 | B2 | 1/2009 | Patterson et al. |
| 7,516,286 | B1 | 4/2009 | Dalal et al. |
| 7,567,188 | B1 | 7/2009 | Anglin et al. |
| 7,698,532 | B1 * | 4/2010 | Gonzalez ............... 711/202 |
| 7,752,384 | B2 | 7/2010 | Moody et al. |
| 8,127,113 | B1 * | 2/2012 | Sinha et al. ............ 712/34 |
| 2002/0194529 | A1 | 12/2002 | Doucette et al. |
| 2004/0030668 | A1 | 2/2004 | Pawlowski et al. |
| 2004/0083245 | A1 | 4/2004 | Beeler |
| 2006/0020804 | A1 * | 1/2006 | Schleifer et al. .......... 713/176 |
| 2007/0050423 | A1 * | 3/2007 | Whalen et al. ............ 707/200 |
| 2007/0255758 | A1 | 11/2007 | Zheng et al. |
| 2008/0005141 | A1 | 1/2008 | Zheng |
| 2008/0005201 | A1 | 1/2008 | Ting |
| 2008/0133561 | A1 * | 6/2008 | Dubnicki et al. .......... 707/101 |
| 2008/0301134 | A1 | 12/2008 | Miller |

FOREIGN PATENT DOCUMENTS

| | | |
|---|---|---|
| WO | WO-02/08956 A1 | 1/2002 |
| WO | WO 2007/0127360 | 11/2007 |
| WO | WO-2007/127360 A2 | 11/2007 |
| WO | WO 2008/005211 | 1/2008 |
| WO | WO-2008/005211 A2 | 1/2008 |
| WO | WO 2008/005212 | 1/2008 |

OTHER PUBLICATIONS

"Notification of Transmittal of the International Search Report and the Written Opinion of the International Searching Authority, or the Declaration," International Filing Date: May 29, 2008, International Application No. PCT/US2008/006805, Applicant: Network Appliance, Inc., Date of Mailing: Oct. 27, 2008, pp. 1-15.

Akyurek, Sedat, Placing Replicated Data to Reduce Seek Delays, Department of Computer Science, University of Maryland, UMIACS-TR-91-121, CS-TR-2746, Aug. 1991. pp. 11-21.

Bilenko et al., Adaptive Duplicate Detection Using Learnable String Similarity Measures, Published in Proceedings of the Ninth ACM SIGKDD International Conference on Knowledge, Aug. 23, 2003, pp. 1-10.

Bitton, Dina, Disk Shadowing, Proceedings of the 14.sup.th VLDB Conference, LA, CA (1988), 8 pages.

Business Wire, Sepaton Announces Next Generation Data De-Duplication Software; Delivers Industry's Highest Level of De-Duplication Without Affecting Backup Performance, Business Wire, May 2006, 3 pages.

Chaudhuri, Surajit, et al., Self-Tuning Technology in Microsoft SQL Server, Data Engineering Journal 22, Feb. 1999 pp. 20-27.

Chutani, Sailesh, et al., The Episode File System, In Proceedings of the USENIX Winter 1992, 18 pages.

Coyne, Robert A., et al., Storage Systems for National Information Assets, Proc. Supercomputing 92, Minneapolis, Nov. 1992, pp. 626-633.

Crochemore et al., Pattern Matching and Text Compression Algorithms, dated Jan. 8, 2003, retrieved from http://citeseer.comp.nus.edu.sg/595025.html, 50 pages.

$EMC^2$, Celerra File Server Architecture for High Availability, $EMC^2$ Corporation, Aug. 1999, 12 pages.

Finlayson, Ross S., et al., Log Files: An Extended File Service Exploiting Write-Once Storage Department of Computer Science, Stanford University, Report No. STAN-CS-87-1177, Sep. 1987, 14 pages.

Gray, Jim, et al., The Recovery Manager of the System R Database Manager, ACM Computing Surveys, (13)2:223-242 1981, 20 pages.

Hecht, Matthew S., et al. Shadowed Management of Free Disk Pages with a Linked List, ACM Transactions on Database Systems, 8/4, Dec. 1983, pp. 503-514.

Hernandez et al., Real-world Data is Dirty: Data Cleansing and the Merge/Purge Problem, Published in Data Mining and Knowledge Discovery, vol. 2, pp. 1-31 (48 pages).

Hitz, Dave et al., File System Design for an NFS File Server Appliance, Technical Report 3002, Rev. C3/95, presented Jan. 19, 1994, USENIX Winter 1994, 23 pages.

Hong, et al., Duplicate Data Elimination in a SAN File System, Proceedings of the $21^{st}$ IEEE / $12^{th}$ NASA Goddard Conference on Mass Storage Systems and Technologies (2004), 304-314.

Howard, John H, et al., Scale and Performance in a Distributed File System, Carnegie Mellon University, CMU-ITC-87-068, Aug. 5, 1987, 33 pages.

Howard, John H., An Overview of the Andrew File System, Carnegie Mellon University, CMU-ITC-88-062 1988, 6 pages.

Howard, John, H. et al., Scale and performance in a distributed file system, ACM Trans. Computer. System., 6(1), Feb. 1988 pp. 51-81.

Kazar, Michael L., et al., Decorum File System Architectural Overview, USENIX Summer Conference, Anaheim, California, 1990, 13 pages.

Kazar, Michael L., Synchronization and Caching Issues in the Andrew File System, Carnegie Mellon University, CMU-ITC-88-063, 12 pages.

Kemper, Alfons, et al., Performance Tuning for SAP R/3, Data Engineering Journal 22, Feb. 1999 pp. 33-40.

Kent, Jack et al., Optimizing Shadow Recovery Algorithms, IEEE Transactions on Software Engineering, 14(2): 155-168, Feb. 1988.

Kistler, et al., Disconnected Operation in the Coda File System, ACM Transactions on Computer Systems, vol. 10, No. 1, Feb. 1992, pp. 3-25.

Lee et al., IntelliClean: a Knowledge-based Intelligent Data Cleaner, published by ACM International Conference on Knowledge Discovery and Data Mining, pp. 290-294.

Lorie, Raymond, A, Physical Integrity in a large segmented database, ACM Trans. Database Systems, 2(1): 91-104, Mar. 1977.

National Institute of Standards and Technology, Federal Information Processing Standards Publication: The Keyed-Hash Message Authentication Code (HMAC), FIPS PUB 198, Information Technology Laboratory, Gaithersburg, Maryland, Mar. 2002, 20 pages.

Ousterhout, John et al., Beating the I/O Bottleneck: A Case for Log-Structured File Systems, Technical Report, Computer Science Division, Electrical Engineering and Computer Sciences, University of California at Berkeley, Oct. 30, 1988, 18 pages.

Patterson, D., et al., A Case for Redundant Arrays of Inexpensive Disks (RAID), Technical Report, CSD-87-391, Computer Science Division, Electrical Engineering and Computer Sciences, University of California at Berkeley (1987), 26 pages.

Patterson, D., et al., A Case for Redundant Arrays of Inexpensive Disks (RAID), SIGMOD International Conference on Management of Data, Chicago, IL, USA, Jun. 1-3, 1988, SIGMOD Record (17):3:109-16 (Sep. 1988).

Peterson, Zachary Nathaniel Joseph, Data Placement for Copy-on-Write Using Virtual Contiguity, University of CA, Santa Cruz, Master of Science in Computer Science Thesis, Sep. 2002. pp. 1-58.

Quinlan, Sean, A Cached WORM File System, Software-Practice and Experience, 21(12):1289-1299 (1991).

Reichenberger, Delta Storage for Arbitrary Non-Text Files, published in Proceedings of the 3rd International Workshop on Software Configuration Management, Jun. 12-14, 1991, pp. 144-152.

Rosenblum, Mendel, et al. The Design and Implementation of a Log-Structured File System Jul. 24, 1991 pp. 1-15.

Rosenblum, Mendel, The Design and Implementation of a Log-Structured File System, 1992, pp. 1-93.

(56) References Cited

OTHER PUBLICATIONS

Rosenblum, Mendel, et al., The Design and Implementation of a Log-Structured File System, In Proceedings of ACM Transactions on Computer Systems, (10)1:26-52, Feb. 1992.
Rosenblum, Mendel, et al., The LFS Storage Manager, Computer Science Division, Electrical Engin. And Computer Sciences, Univ. of CA, presented at Summer '90 USENIX Technical Conference, Anaheim, CA Jun. 1990, 16 pages.
Schiefer, Berni, et al., DB2 Universal Database Performance Tuning, Data Engineering Journal 22, Feb. 1999 pp. 12-19.
Seltzer, Margo I., et al., Journaling Versus Soft Updates: Asynchronous Meta-Data Protection in File Systems, Proceedings of 200 USENIX Annual Technical Conference, Jun. 18-23, 2000.
Shasha, Dennis, Tuning Time Series Queries in Finance: Case Studies and Recommendations, Data Engineering Journal 22, Feb. 1999 pp. 41-47.
Sidebotham, Bob, Volumes: The Andrew File System Data Structuring Primitive, EEUG Conference Proceedings, Manchester, UK, Autumn 1986. pp. 1-8.
Subramanian, Muralidhar, et al., Performance Challenges in Object-Relational DBMSs, Data Engineering Journal 22, Feb. 1999 pp. 28-32.
Weikum, Gerhard, et al., Towards Self-Tuning Memory Management for Data Servers, Data Engineering Journal 22, Feb. 1999 pp. 3-11.
West, Michael, et al. The ITC Distributed File System: Prototype and Experience, Carnegie-Mellon University, Technical Report CMU-ITC-040, Mar. 1985, 17 pages.
Zayas, Edward R., AFS-3 Programmer's Reference: Architectural Overview, Transarc Corporation, Pittsburgh, PA, 1.0 edition 1991, 37 pages.
Zheng, et al., Method and Apparatus for Identifying and Eliminating Duplicate Data Blocks and Sharing Data Blocks in a Storage System, U.S. Appl. No. 11/105,895, filed Apr. 13, 2005, 46 pages.
Notification of Transmittal of the International Search Report and the Written Opinion of the International Searching Authority, or the Declaration, International Filing Date: Apr. 26, 2007, International Application No. PCT/US2007/010222, Applicant: Network Appliance, Inc., Date of Mailing: Apr. 9, 2008, pp. 1-15.
Notification of Transmittal of the International Search Report and the Written Opinion of the International Searching Authority, or the Declaration, International Filing Date: Jun. 25, 2007, International Application No. PCT/US2007/014664, Applicant: Network Appliance, Inc., Date of Mailing: Apr. 9, 2008, pp. 1-12.
Notification of Transmittal of the International Search Report and the Written Opinion of the International Searching Authority, or the Declaration, International Filing Date: Jun. 25, 2007, International Application No. PCT/US2007/014666, Applicant: Network Appliance, Inc., Date of Mailing: Feb. 22, 2008, pp. 1-18.

\* cited by examiner

SYSTEM AND METHOD FOR ACCELERATING ANCHOR POINT DETECTION

RELATED APPLICATION

The present invention is related to United States Publication No. US2007/0255758, published on Nov. 1, 2007, entitled SYSTEM AND METHOD FOR SAMPLING BASED ELIMINATION OF DUPLICATE DATA, by Ling Zheng, et al, the contents of which are hereby incorporated by reference.

FIELD OF THE INVENTION

The present invention relates generally to data storage compression and, more specifically, to accelerating anchor point detection for use in sampling based elimination of duplicate data (de-duplication).

BACKGROUND OF THE INVENTION

A storage system typically comprises one or more storage devices into which information may be entered, and from which information may be obtained, as desired. The storage system includes a storage operating system that functionally organizes the system by, inter alia, invoking storage operations in support of a storage service implemented by the system. The storage system may be implemented in accordance with a variety of storage architectures including, but not limited to, a network-attached storage environment, a storage area network and a disk assembly directly attached to a client or host computer. The storage devices are typically disk drives organized as a disk array, wherein the term "disk" commonly describes a self-contained rotating magnetic media storage device. The term disk in this context is synonymous with hard disk drive (HDD) or direct access storage device (DASD).

Data storage is a central part of many industries that operate in archival and compliance application environments, such as banks, government facilities/contractors and securities brokerages. In many of these environments, it is necessary to store selected data, e.g., electronic-mail messages, financial documents and/or transaction records, in an immutable manner, possibly for long periods of time. Typically, data backup operations are performed to ensure the protection and restoration of such data in the event of a failure. However, backup operations often result in the duplication of data on backup storage resources, such as disks, causing inefficient consumption of the storage space on the resources. One form of long term archival storage is the storage of data on electronic tape media. A noted disadvantage of physical tape media is the slow data access rate and the added requirements for managing a large number of physical tapes. In response to these noted disadvantages, several storage system vendors provide virtual tape library (VTL) systems that emulate tape storage devices using a plurality of the disks. In typical VTL environments, the storage system serving as the primary storage performs a complete backup operation of the storage system's file system (or other data store) to the VTL system. Multiple complete backups may occur over time thereby resulting in an inefficient consumption of storage space on the VTL system. It is thus desirable to eliminate duplicate data on the storage resources, such as disks associated with a VTL system, and ensure the storage of only a single instance of data to thereby achieve storage compression.

One technique for achieving a reduction in data duplication (de-duplication) is described in U.S. Pat. No. 5,990,810, entitled METHOD FOR PARTITIONING A BLOCK OF DATA INTO BLOCKS AND FOR STORING AND COMMUNICATING SUCH SUBBLOCKS, by Ross Williams, issued Nov. 23, 1999 (hereafter "the '810 patent"). The method described in the '810 patent first utilizes a rolling hash function to generate a plurality of sub-blocks of data. The rolling hash utilizes a fixed size window of data that results in a boundary being placed between two sub-blocks. Once a block of data has been partitioned into sub-blocks, the hash value of each sub-block is calculated to form a table of hash values. The hash table is then used to determine if a new sub-block is identical to any sub-block whose hash value has previously been stored in the hash table. To perform this determination, the new sub-block's hash value is calculated and compared with the values contained in the hash table. If the new sub block's hash value has been previously stored within the hash table, then the sub block identified with the stored hash value is considered identical to the new sub block. In such a case, the new sub block is replaced with a pointer to the previously stored sub block, thereby reducing the amount of storage space required for the sub block. A noted disadvantage of the technique described in the '810 patent is that it requires performance of an extensive number of computationally intensive hashing calculations, which may affect the overall performance of a storage/VTL system implementing such a method. Another noted disadvantage is that the hash table will become larger as the size of a data set increases and may not scale to large data sets such as terabytes or petabytes of data.

Another technique, as mentioned in DELTA STORAGE FOR ARBITRARY NONTEXT FILES by Chris Reichenberger, in *Proceedings of the 3rd International Workshop on Software Configuration Management*, Trondheim, Norway, 1214 June 1991 (June 1991), ACM, pp. 144-152, is to use the hashes of data to find the longest common data sequence. However, the above method to compute and compare the hashes of all possible substrings in a data set does not employ any sampling technique. Therefore, it is not scalable for large data sets.

A noted disadvantage of the above-described techniques is that de-duplication is performed as a two step process. The un-de-duplicated data is first stored, thereby requiring sufficient storage space. Secondly, the stored data is de-duplicated using one of the above-mentioned de-duplication techniques. The use of a two step de-duplication procedure introduces additional complexity into de-duplication systems. Furthermore, two step de-duplication increases the overall cost of ownership by requiring system installations to have sufficient space to initially store the un-de-duplicated data. Furthermore, the de-duplication procedure typically significantly increases the overall processing load on a main processor, such as a central processing unit (CPU), of the system performing the de-duplication. As a result, other processes may be impaired while such de-duplication is ongoing.

SUMMARY OF THE INVENTION

The present invention overcomes the disadvantages of the prior art by providing a system and method for accelerating anchor point detection for use in a sampling based technique for eliminating duplicate data (de-duplication) stored on storage resources, such as disks. According to the invention, when a new data set, e.g., a backup data stream, is received by a server, e.g., a storage system or virtual tape library (VTL) system implementing the invention, one or more anchors are identified within the new data set. As used herein, an anchor is defined as a point within the data set that defines a region of interest for potential data de-duplication. Anchors are illustratively located by performing a rolling hash of the data set. In such cases, an anchor point ("anchor") is located within a fixed size region defining a signature width.

The anchors are identified using novel anchor detection circuitry in accordance with an illustrative embodiment of the present invention. Upon receipt of the new data set by, for example, a network adapter of the VTL system, the data set is transferred using direct memory access (DMA) operations to a memory associated with anchor detection circuitry that is operatively interconnected with the system. The anchor detection circuitry may be implemented as, for example, a field programmable gate array (FPGA) to quickly identify anchors within the data set. Illustratively, the anchor detection circuitry implements a rolling hash to locate anchor locations. The anchor detection circuit may utilize any of a plurality of techniques for implementing a rolling hash. As the anchor detection process is performed using separate hardware circuitry, the load on a main processor of the system is reduced, thereby enabling line speed de-duplication. Once the anchor locations have been determined, the anchor detection hardware passes the set of anchor point locations to a VTL module executing on the main processor to complete the de-duplication process.

BRIEF DESCRIPTION OF THE DRAWINGS

The above and further advantages of the invention may be better understood by referring to the following description in conjunction with the accompanying drawings in which like reference numerals indicate identical or functionally similar elements.

DETAILED DESCRIPTION OF AN ILLUSTRATIVE EMBODIMENT

A. Storage System Environment

Figure 1:
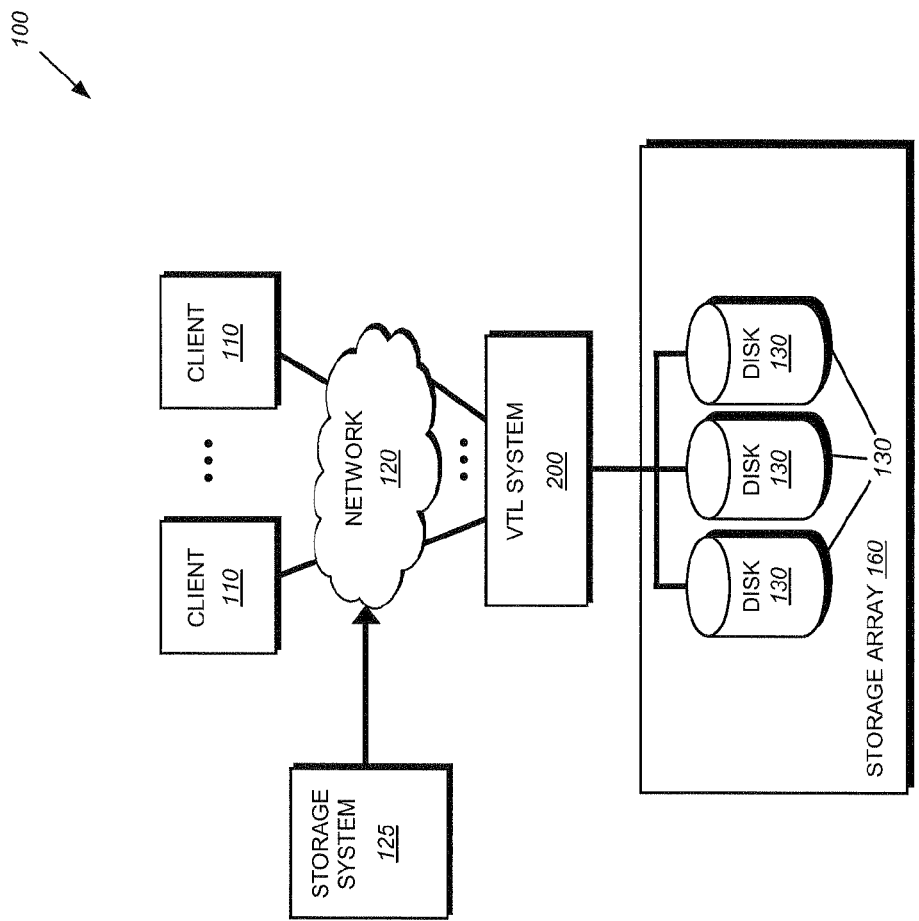
FIG. 1 is a schematic block diagram of an exemplary storage system environment including a virtual tape library (VTL) system in accordance with an illustrative embodiment of the present invention.

FIG. 1 is a schematic block diagram of a storage system environment 100 that may be advantageously used with the present invention. The storage system environment 100 comprises a storage system 125 interconnected with a plurality of clients 110 by network 120. Illustratively, the network 120 may be embodied as an Ethernet network or a Fibre Channel (FC) network. Also interconnected with the network 120 is a virtual tape library (VTL) system 200 that illustratively implements the data de-duplication technique of the present invention. The VTL system 200 is operatively connected to one or more storage devices, such as disks 130, organized as a storage array 160.

In operation, the storage system 125 services data access requests from the clients 110. Each client 110 may be a general-purpose computer configured to execute applications and interact with the storage system 125 in accordance with a client/server model of information delivery. That is, the client may request the services of the storage system, and the system may return the results of the services requested by the client, by exchanging packets over the network 120. The clients may issue packets including file-based access protocols, such as the Common Internet File System (CIFS) protocol or Network File System (NFS) protocol, over TCP/IP when accessing information, such as data, in the form of data containers, such as files and directories. Alternatively, the client may issue packets including block-based access protocols, such as the Small Computer Systems Interface (SCSI) protocol encapsulated over TCP (iSCSI) and SCSI encapsulated over Fibre Channel (FCP), when accessing information in the form of data containers, such as blocks.

When an administrator of the storage system 125 desires to perform a backup operation, conventional tape backup software may be utilized with the storage system 125 to perform a backup operation to the VTL system 200. The VTL system 200 appears to the storage system 125 as a remote tape drive; thus, the storage system 125 may perform a conventional tape backup operation to the VTL system 200 using conventional tape backup software. Typically, each backup operation results in copying of an entire file system stored by the storage system 125 to the VTL system 200, e.g., as a "backup". A noted result of such copying is that the VTL system 200 may include significant amounts of duplicated data, i.e., data that remains common among each of the backups of storage system 125 and/or redundant data between backups of different clients 110.

B. Virtual Tape Library System

Figure 2:
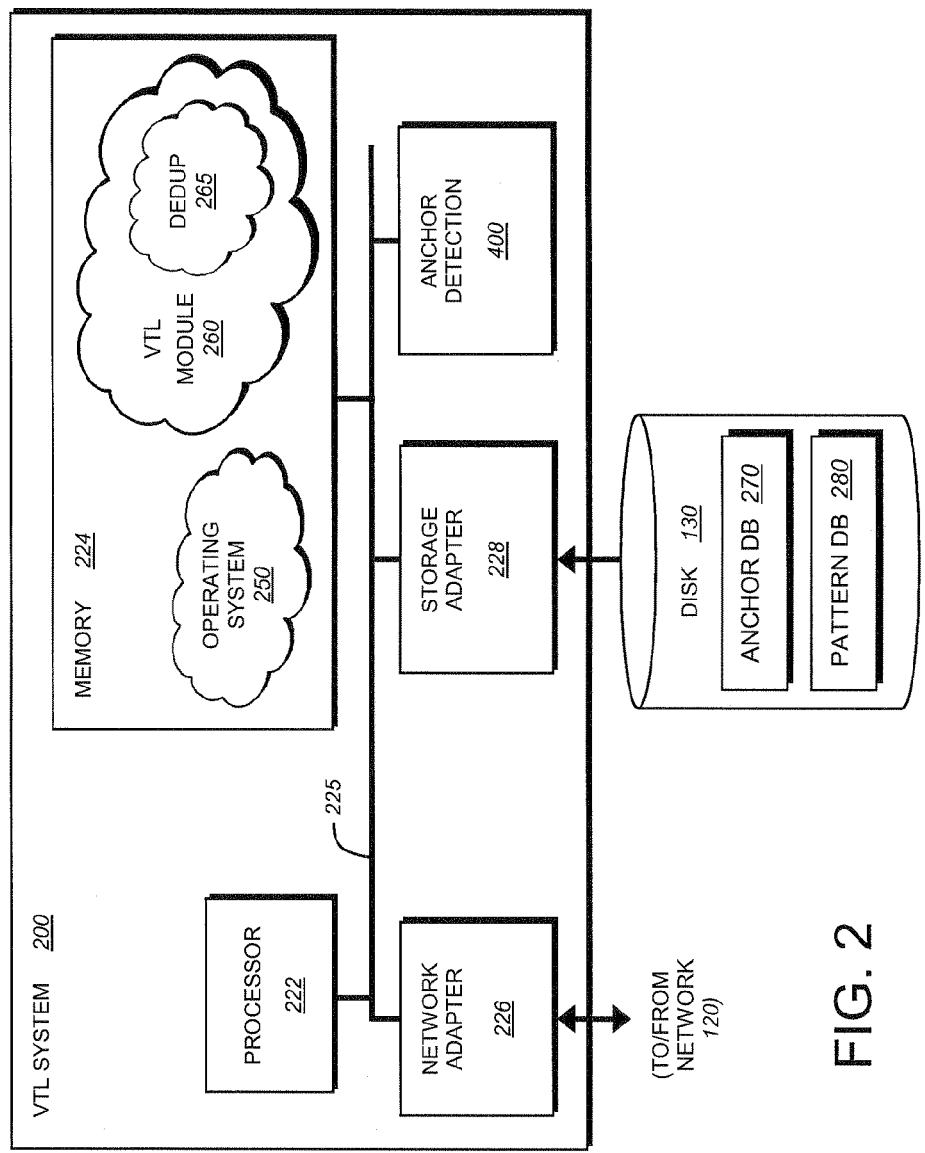
FIG. 2 is a schematic block diagram of a VTL system in accordance with an illustrative embodiment of the present invention.

FIG. 2 is a schematic block diagram of a VTL system 200 that may be advantageously used with the present invention. Illustratively, the VTL system 200 is a computer that provides storage service relating to the organization of information on storage devices, such as disks 130 of a local storage (disk) array 160. The VTL system 200 illustratively comprises a processor 222, a memory 224, one or more network adapters 226, anchor detection circuitry 400 and one or more storage adapters 228 interconnected by a system bus 225. Each network adapter 226 comprises the mechanical, electrical and signaling circuitry needed to connect the VTL system 200 to storage system 125 over the network 120. The VTL system 200 also includes an operating system 250 that interacts with various modules, such as virtual tape library (VTL) module 260, described further below. The operating system 250 may implement a logical data object store on disks 130 and for use by applications, such as VTL module 260 executing on the VTL system 200. As described herein, the logical data object store is illustratively embodied as an anchor database (DB) 270 and a pattern DB 280.

In the illustrative embodiment, the memory 224 comprises storage locations that are addressable by the processor and adapters for storing software program code, such as operating system 250 and VTL module 260. The processor and adapters may, in turn, comprise processing elements and/or logic circuitry configured to execute the software code and manipulate the data structures. It will be apparent to those skilled in the art that other processing and memory means, including various computer readable media, may be used for storing and executing program instructions pertaining to the inventive technique described herein.

The storage adapter 228 cooperates with the operating system 250 executing on the VTL system 200 to store and retrieve information requested on any type of attached array of writable storage device media such as video tape, optical, DVD, magnetic tape, bubble memory, electronic random access memory, micro-electro mechanical and any other similar media adapted to store information, including data and parity information. However, as illustratively described herein, the information is preferably stored on the disks 130, such as HDD and/or DASD, of local storage array 160. The storage adapter includes input/output (I/O) interface circuitry that couples to the disks over an I/O interconnect arrangement, such as a conventional high-performance, FC serial link topology.

As noted, also interconnected with the system bus 225 is anchor detection hardware 290. In the illustrative embodiment, the anchor detection circuit 400 may comprise a card, e.g., a peripheral connection interface (PCI) card having one or more field programmable gate arrays (FPGAs) that are connected to the system bus 225. In alternative embodiments, the anchor detection circuit 400 may comprise a daughtercard or may be directly implemented on the motherboard of the VTL system 200. More generally, the anchor detection circuit may comprise a programmable logic device (PLD), e.g., a FPGA, etc. Illustratively, the anchor detection circuit 400 identifies anchors within a data set received via, e.g., the network adapter 226. Upon identifying the anchors, the anchor detection circuit 400 passes the locations of the anchors to other modules, e.g., the VTL module 260, for use in performing de-duplication in accordance with an illustrative embodiment of the present invention. Anchor detection is typically the most computationally intensive step of de-duplication; accordingly, by offloading anchor detection computation to the anchor detection circuit 400, the processor 222 may be able to perform the other steps of de-duplication at line speed, thereby obviating the need to first store the data in an un-de-duplicated state before de-duplicating the data. This enables a reduction in the total cost of ownership of the system as well as improves performance of the system as deduplication does not need to be done at a later point in time.

As noted, the operating system 250 illustratively implements a logical data object store on disks 130. It should be also noted that in alternative embodiments, other forms of data organization may be utilized including, for example, a file system. As such, the description of utilizing a data object store should be taken as exemplary only. Furthermore, the VTL module 260 cooperates with the operating system 250 to implement virtual tape library functionality for the VTL system 200. Illustratively, the VTL module 260 stores data using the data object store. Notably, the VTL module 260 also implements the data de-duplication technique of the present invention using, e.g., dedup module 265. Illustratively, dedup module 265 is a component of the VTL module 260. However, in alternative embodiments, the dedup module 265 may comprise a module separate from the VTL module 260. Furthermore, in other alternative embodiments the dedup module 265 may be included within operating system 250. As such, the description of dedup module 265 being a component of VTL module 250 should be taken as exemplary only.

C. Sampling Based Data De-Duplication with Hardware Anchor Detection

The present invention provides a system and method for accelerated anchor detection for use with a sampling based technique for eliminating duplicate data (de-duplication) stored on storage resources, such as disks. According to the invention, when a new data set, e.g., a backup data stream, is received by a server, e.g., a storage system or virtual tape library (VTL) system implementing the invention, one or more anchors are identified within the new data set. As used herein, an anchor is defined as a point within the data set that defines a region of interest for potential data de-duplication. Anchors may be located by performing a rolling hash of the data set. In such cases, an anchor point ("anchor") is located within a fixed size region defining a signature width. Anchors may also be selected based on location within data containers, e.g., a file, or other contextual information, e.g., at predefined offsets within the data set.

The anchors are identified using novel anchor detection circuitry in accordance with an illustrative embodiment of the present invention. Upon receipt of the new data set by, for example, a network adapter of the VTL system, the data set is transferred using direct memory access (DMA) operations to a memory associated with anchor detection circuitry that is operatively interconnected with the system. The anchor detection circuitry may be implemented as, for example, a FPGA to quickly identify anchors within the data set. As the anchor detection process is performed using hardware circuitry, the load on a main processor of the system is reduced, thereby enabling line speed de-duplication. Once the anchor locations have been determined, the anchor detection hardware passes the set of anchor point locations to a VTL module executing on the main processor to complete the de-duplication process.

Figure 3:
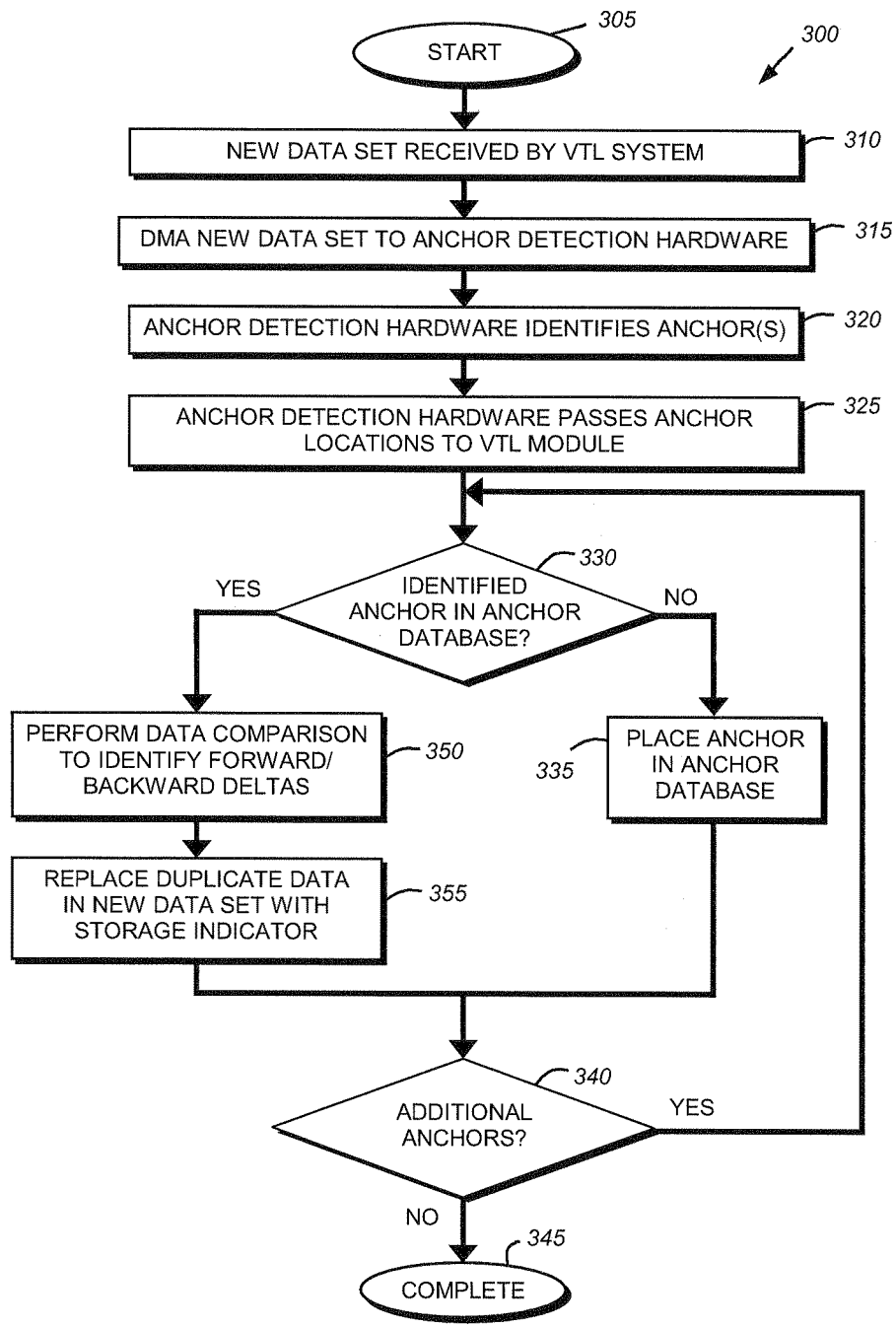
FIG. 3 is a flowchart detailing the steps of a procedure for performing a sampling based data de-duplication procedure with hardware assisted anchor point detection in accordance with an illustrative embodiment of the present invention.

FIG. 3 is a flowchart detailing the steps of a sampling based data de-duplication procedure 300 with hardware based anchor detection in accordance with an illustrative embodiment of the present invention. The procedure 300 begins in step 305 and continues to step 310 where a new data set is received by a server, such as the VTL system 200. In the illustrative environment 100 of FIG. 1, the received data set may comprise a new tape backup data stream directed to the VTL system 200 from the storage system 125. However, in alternate embodiments, any data set may be utilized on any computer including, for example, a file stored within the storage system 125. As such, the description of the data set being a tape backup stream directed to a VTL system 200 should be taken as exemplary only. As noted, in alternate embodiments, any form of data set may be utilized on any computer. Thus, the teachings of the present invention may be utilized in environments different from the VTL system environment described herein.

In step 315, the new data set is transferred to the anchor detection hardware 400 using, for example, direct memory access (DMA) operations. For example, the network adapter 226 may DMA received data to the anchor detection hardware 400 as it is received via network 120. Anchor detection hardware 400 then identifies any anchors in the new data set in step 320. Illustratively anchors may be identified using any of a plurality of rolling hash techniques. One exemplary technique is described further below in reference to FIG. 4. Other exemplary techniques are described in the above-incorporated United States Publication No. US2007/0255758, published Nov. 1, 2007, entitled SYSTEM AND METHOD FOR SAMPLING-BASED ELIMINATION OF DUPLICATE DATA, by Ling Zheng, et al. Upon identifying the set of anchors, the anchor detection hardware 290 passes the anchor locations to the VTL module in step 325. The anchor detection hardware 400 may pass the anchor locations to the VTL module via, for example, DMA operations or may transfer the set of locations to a predefined memory region accessible by the VTL module. Alternatively, the anchor detection hardware may utilize other forms of interprocess communication (IPC) to transfer the set of anchor locations to the VTL module.

Once the set of anchor locations have been passed to the VTL module, the VTL module 260 determines whether the identified anchor is located within the anchor database 270 in step 330. If the identified anchor is not stored within the anchor database, the procedure 300 branches to step 335 where the VTL module places the anchor within the anchor database. Certain anchors may not be stored in the anchor database, e.g., anchors that occur too frequently to be of use. The VTL module may be configured to detect these frequently occurring anchors or may, in alternate embodiments, track frequently occurring anchors to identify those that should not be maintained in the anchor database. In step 340, a determination is made as to whether additional anchors are located within the data set. If so, the procedure 300 loops back to step 330 where the VTL module checks whether the next anchor is in the anchor database. Otherwise, the procedure 300 completes in step 345.

However, if the identified anchor is located within the anchor database 270, the VTL module 260 begins a bit-by-bit (or byte-by-byte) comparison of the region surrounding the anchor within the pattern database 280 and the anchor point within the received data set to identify forward and backward delta values (step 350). The delta values identify the number of consecutive bits forward/backward from the anchor location that are identical between the region in the pattern database 280 and the received data set. For example, if the data is identical for a thousand bits in front of the anchor point and 15 bits behind the anchor point, then the backward delta value would be set equal to 15 and the forward delta value would be set equal to 1000. It should be noted that in certain situations, depending upon placement of anchors, a particular delta value may be equal to zero. For example, if the anchor point is selected at the beginning of the window utilized by the rolling hash, no bits prior to the anchor point may match with the pattern database. The backward/forward delta values ("deltas") typically encompass the width of the sliding hash window; however, this is not a requirement of the present invention. By utilizing the anchor point along with forward and backward deltas, a region of duplicate data may be identified i.e., the data that ranges from the backward delta (number of bits) behind the anchor point to the forward delta (number of bits) in front of the anchor point. According to the invention, this identified region of duplicate data may be eliminated from the storage, thereby achieving compression and improving the efficiency of the use of storage resources. A further description of identifying backward/forward delta values is described in the above-incorporated United States Publication No. US2007/0255758.

In step 355, the identified region of duplicate data in the new data set is then replaced with a storage indicator. Illustratively, the storage indicator identifies the anchor location as well as the forward and backward deltas. Compression of the data set is obtained when the storage indicator is of a smaller size then the duplicate data being replaced. Thus, depending upon implementation details, a minimum size may be required before duplicate data is replaced. For example, if a storage indicator requires 256 bits, unless (forward delta value+backward delta value)>256, no compression will occur. It should be noted that in alternate embodiments, the system may include an administrator controlled threshold defining the minimum size before replacement occurs. Such a threshold may enable the administrator to tune the performance of the system based on the nature of the expected data. Thus, the system may include both static, e.g., size of storage indicator, and dynamic, e.g., administrator set, thresholds. Again, if there are no additional anchors in the data set, the procedure completes in step 345.

It should be noted that during step 350, the region of duplicate data being identified may have additional anchor points. The next anchor point to be processed will be in the new data after the identified region of duplicate data. Further, skipped anchor points might not need to be calculated using the anchor identification technique. The set of new anchor points in the duplicate data region will be the same as the set in the original data region. The performance benefit is that relatively few anchor points will have to be calculated and processed when processing long streams of matching data.

As further noted, the present invention offloads anchor detection from the processor 222 to the anchor detection hardware 400 to thereby accelerate anchor detection. As anchor detection is typically the most computationally intensive aspect of deduplication, by accelerating anchor detection, the overall deduplication procedure may be accomplished at line speed, thereby obviating the need to initially store un-de-duplicated data prior to de-duplication.

Figure 4:
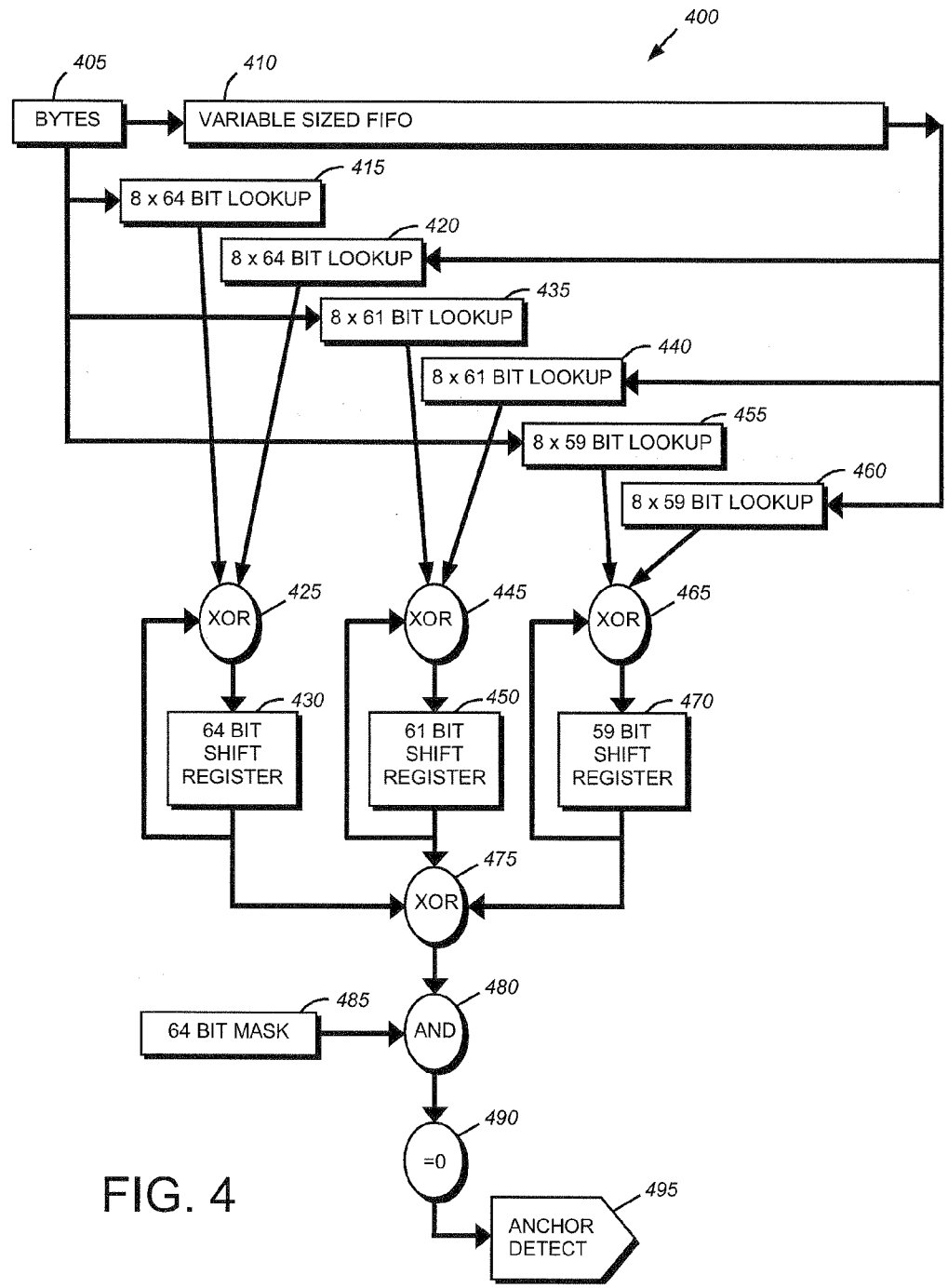
FIG. 4 is a schematic block diagram of an anchor detection hardware circuit arrangement for locating anchors in accordance with an illustrative embodiment of the present invention.

FIG. 4 is a schematic block diagram of an exemplary hardware circuit arrangement 400 for performing anchor detection in accordance with an illustrative embodiment of the present invention. Illustratively, anchors are detected by using a rolling hash on the data. This illustrative technique for implementing a rolling hash is further described in Indian Patent Application No. 938/Del/2007, filed Apr. 30, 2007, entitled SYSTEM AND METHOD FOR IMPLEMENTING AN EFFICIENT ROLLING HASH, by Roger Stager, et al, the contents of which are hereby incorporated by reference. Incoming data bytes 405 are sent both to a variable sized first in, first out (FIFO) buffer 410 that is sized to a hash window as well as to a series of lookup tables 415, 435, 455. The output of each lookup table 415, 435, 455 is fed into one of three Boolean, e.g. XOR, operators 425, 445, 465. Illustratively, each of the look up tables outputs a random value based on the data byte entering the table.

The output of the FIFO 410 is fed into a second set of lookup tables 420, 440, 460. The output of the FIFO 410 may comprise a byte that is "pushed" or rotated out of the hash window by a byte 405 entering the FIFO 410. Thus, during operation, a byte 405 enters FIFO 410 and is moved along the width of the rolling hash window until it is output from the FIFO 410. The outputs of the lookup tables 420, 440, 460 are also fed into XOR operations 425, 445, 465. Note that the byte values output from tables 420, 440,460 have been rotated an appropriate number of bits to cancel the effect of the byte when it first entered the sliding window. The outputs of each of the XOR operators 425, 445, 465 are fed into shift registers 430, 450, 470. The outputs of the shift registers are fed back into the respective XOR operations as well as into a XOR operator 475. The XOR operator 475 combines the values from all three shift registers to generate a single hash value for the data window.

The result of the XOR operation 475 is then logically ANDed in operation 480 with a predetermined, e.g., 64-bit, mask 485. Illustratively, the 64-bit mask 485 is utilized to identify whether a predefined bit pattern is the result of the XOR operation 475. A detector 495 determines whether the result of the logical AND operation is zero. If so, an anchor has been detected and the location is recorded as an anchor point.

It should be noted that while this example utilizes three lookup tables and shift registers, the principles of the present invention may be utilized with other numbers of lookup tables and/or shift registers.

Furthermore, while this description has been written in terms of storage de-duplication, the principles of the present invention may be utilized to provide de-duplication over communication links. In such an alternate embodiment, a sending (source) system may perform the above described de-duplication technique to minimize the amount of bandwidth utilized in transmitting data to a destination system. The source and destination systems will need to work to ensure that they share synchronized pattern and anchor databases.

The foregoing description has been directed to specific embodiments of this invention. It will be apparent, however, that other variations and modifications may be made to the described embodiments, with the attainment of some or all of their advantages. For instance, it is expressly contemplated that the teachings of this invention can be implemented as software, including a computer-readable medium having program instructions executing on a computer, hardware, firmware, or a combination thereof. Furthermore, it should be noted that while this description has been written in terms of VTL system, the teachings of the present invention are not so limited. As noted above, while the present invention has been written in terms of a FPGA, the anchor detection circuit may comprise any form of programmable logic device (PLD). As such, the description of the use of a FPGA should be taken as exemplary only. The present invention may be utilized in any computer environment using any data store, including, e.g., a file system. Accordingly this description is to be taken only by way of example and not to otherwise limit the scope of the invention. Therefore, it is the object of the appended claims to cover all such variations and modifications as come within the true spirit and scope of the invention.

The invention claimed is:

1. A method, comprising:
receiving a data set at a storage system;
in response to receiving the data set, detecting one or more anchor locations in the data set by an anchor detection circuitry of the storage system, wherein the anchor detection circuitry is a hardware device dedicated to detecting the one or more anchor locations;
transferring each anchor locations to a data de-duplication module executed by a processor of the storage system;
determining if the anchor location is located in a database;
if the anchor location is not located in the database, adding the anchor location to the database;
if the anchor location is located in the database, examining, by the de-duplication module executed by the processor, bits preceding the anchor location utilizing a first delta value and the bits following the anchor location utilizing a second delta value to identify duplicate data; and
in response to identifying the duplicate data, removing the duplicate data from the data set prior to storing the data set on a storage device operatively connected to the storage system.

2. The method of claim 1 wherein the anchor detection circuitry comprises a programmable logic device.

3. The method of claim 2 wherein the programmable logic device comprises a field programmable gate array.

4. A method for anchor detection, comprising:
receiving a data set from a client by a storage system;
in response to receiving the data set, transferring the data set to an anchor detection circuitry of the storage system, wherein the anchor detection circuitry is a hardware device dedicated to detecting the one or more anchor locations;
detecting one or more anchor locations of the data set by the anchor detection circuitry;
transferring each anchor locations to a de-duplication module executed by a processor of the storage system;
determining if the anchor location is located in a database;
if the anchor location is not located in the database, adding the anchor location to the database; and
if the anchor location is located in the database, performing the data de-duplication for the data set utilizing the anchor location, wherein the anchor detection circuitry and the processor are separate hardware devices.

5. The method of claim 4 wherein the data set comprises a tape backup data set.

6. The method of claim 4 wherein receiving the data set comprises receiving the data set by a network adapter of the storage system.

7. The method of claim 4 further comprising utilizing a direct memory access operation to transfer the data set to the anchor detection circuitry.

8. The method of claim 4 wherein detecting the one or more anchor locations further comprises performing a rolling hash on the data set.

9. A system, comprising:
anchor detection hardware configured to receive a data stream, the anchor detection hardware further configured to identify one or more anchor locations of the data stream where the anchor detection hardware is a hardware device dedicated to identifying each anchor location, the anchor detection hardware further configured to transfer the anchor location to a de-duplication module executed by a processor of the storage system; and
the de-duplication module executed by the processor and configured to: (i) determine if the anchor location is located in a database, (ii) add the anchor location to the database if the anchor location is not located in the database, and (iii) identify duplicate data using the anchor location and remove the duplicate data from the received data stream if the anchor location is located in the database, wherein the anchor detection hardware and the processor are separate hardware devices.

10. The system of claim 9 wherein the anchor detection hardware comprises a field programmable gate array.

11. The system of claim 9 wherein the anchor detection hardware comprises a card operatively interconnected with a system bus.

12. The system of claim 9 further comprising a network adapter of the storage system configured to receive the data stream and further configured to transfer the data stream to the anchor detection hardware.

13. The system of claim 12 wherein the network adapter transfers the data stream using direct memory access.

14. The system of claim 9 wherein the data stream comprises a tape backup data stream.

15. The system of claim 9 wherein the anchor detection hardware identifies the one or more anchor locations by performing a rolling hash on the data stream.

16. The system of claim 9 wherein the de-duplication module comprises a portion of a virtual tape library module.

17. The system of claim 9 wherein the one or more anchor locations are stored in a data store, and wherein the de-duplication module utilizes the one or more anchor locations in the data store to perform the data de-duplication on the data stream.

18. The system of claim 9 wherein the data de-duplication of the data stream occurs prior to storing the data stream on a storage device.

19. A system comprising:
means for receiving a data set from a client;
means for transferring the data set to an anchor detection hardware of a storage system in response to receiving the data set;
means for detecting one or more anchor locations in the data set by the anchor detection hardware that is a hardware device dedicated for detecting anchor locations;

means for transferring each anchor location from the anchor detection hardware to a de-duplication module executed by a processor of the storage system, wherein the anchor detection hardware and the processor are separate hardware devices; and means for determining if the anchor location is located in a database in response to transferring the anchor location;

means for adding the anchor location to the database if the anchor location is not located in the database;

means for examining bits preceding the anchor location utilizing a first delta value and means for examining the bits following the anchor location utilizing a second delta value to identify duplicate data if the anchor location is located in the database; and means for removing the duplicate data from the data set prior to storing the data set on a storage device operatively connected to the storage system.

20. The system of claim 19 wherein the data set comprises a tape backup data set.

* * * * *

UNITED STATES PATENT AND TRADEMARK OFFICE
CERTIFICATE OF CORRECTION

| | | |
|---|---|---|
| PATENT NO. | : 8,762,345 B2 | Page 1 of 1 |
| APPLICATION NO. | : 11/756044 | |
| DATED | : June 24, 2014 | |
| INVENTOR(S) | : Steven C. Miller et al. | |

It is certified that error appears in the above-identified patent and that said Letters Patent is hereby corrected as shown below:

Claims:
Claim 4, col. 9, line 63:
~~detecting one or more anchor locations to a de-duplication mod-~~ should read
<u>detecting one or more anchor location to a de-duplication mod-</u>

Signed and Sealed this
Twenty-third Day of September, 2014

Michelle K. Lee
*Deputy Director of the United States Patent and Trademark Office*